United States Patent [19]
Liu et al.

[11] Patent Number: 5,671,175
[45] Date of Patent: Sep. 23, 1997

[54] CAPACITOR OVER BITLINE DRAM CELL

[75] Inventors: Jiann Liu, Irving; Clarence W. Teng, Plano, both of Tex.

[73] Assignee: Texas Instruments Incorporated, Dallas, Tex.

[21] Appl. No.: 670,079

[22] Filed: Jun. 26, 1996

[51] Int. Cl.$^6$ .................................................. G11C 11/24
[52] U.S. Cl. .............................. 365/149; 365/51; 257/296; 257/908
[58] Field of Search ........................... 365/149, 182, 365/63, 51; 257/296, 908

[56] References Cited

U.S. PATENT DOCUMENTS

| | | | |
|---|---|---|---|
| 5,291,433 | 3/1994 | Itoh | 365/63 |
| 5,392,232 | 2/1995 | Kim et al. | 365/149 |

*Primary Examiner*—David C. Nelms
*Assistant Examiner*—Huan Hoang
*Attorney, Agent, or Firm*—Jacqueline J. Garner; W. James Brady III; Richard L. Donaldson

[57] ABSTRACT

A DRAM array (100) having reduced bitline capacitance. The DRAM cell includes a pass transistor and a storage capacitor (150). An isolation structure (108) surrounds the DRAM cell. The bitline (140) is connected to a source/drain region (120b) of the pass transistor using a first polysilicon plug (112). A second polysilicon plug (110) connects the storage capacitor (150) to the other source/drain region (120a&c) of the pass transistor. Both polysilicon plugs (110, 112) extend through an interlevel dielectric layer (116) to one of the source/drain region (120a-c) of the pass transistor, but neither extends over the isolation structure (108). If desired, either the storage capacitor (150) or the bitline (140) may be offset from the source/drain regions (120a-c).

16 Claims, 7 Drawing Sheets

CAPACITOR OVER BITLINE DRAM CELL

FIELD OF THE INVENTION

This invention generally relates to dynamic random access memories.

BACKGROUND OF THE INVENTION

Dynamic random access memories (DRAMs) comprise an array of individual cells for storing information. These cells are dynamic in that they will only hold a bit of information for a short period of time. Therefore, the cells must be read and refreshed at periodic intervals. The most common cell configuration consists of one transistor 12 and one capacitor 14 as shown in FIG. 1. The transistor 12 is a pass transistor and is connected between a bitline 16 and the capacitor 14. The pass transistor 12 is gated by a wordline signal 18. A bit of information is read from the cell to the associated bitline or written to the cell from the bitline through pass transistor 12.

A cross-section of a prior art DRAM cell is shown in FIG. 2. This is known as a DASH (diagonal active-stacked-capacitor cell with highly packed storage node) type cell. FIG. 2 actually shows a pair of DRAM cells sharing a common source drain region 22a. Source/drain regions 22a–b of pass transistors 12 are formed in a substrate 20. Wordlines 18 form the gates of pass transistors 12. The bitline 16 is connected to the common source/drain region 22a between wordlines 18 and the storage node 24 is connected to the other source/drain region 22b of each transistor 12. Storage node 24, capacitor dielectric 26 and top plate 28 form capacitor 14. Capacitor 14 is formed overlying bitline 16 in this cell making it a capacitor over bitline (COB) type cell. However, as the number of cells in a DRAM increases, each bitline is connected to more cells and bitline capacitance increases. As technology moves toward the 256 Meg DRAM, bitline capacitance of prior art designs becomes unacceptably high. Accordingly, there is a need for a DRAM cell having reduced bitline capacitance.

SUMMARY OF THE INVENTION

A DRAM having reduced bitline capacitance is disclosed herein. The DRAM cell includes a pass transistor and a storage capacitor. An isolation structure surrounds the DRAM cell. The bitline is connected to a source/drain region of the pass transistor using a first polysilicon plug. A second polysilicon plug connects the storage capacitor to the other source/drain region of the pass transistor. Both polysilicon plugs extend through an interlevel dielectric layer to one of the source/drain regions of the pass transistor, but neither extends over the isolation structure. If desired, either the storage capacitor or the bitline may be offset from the source/drain regions.

An advantage of the invention is providing a DRAM having reduced bitline capacitance.

A further advantage of the invention is providing a DRAM having a reduced soft error rate.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention will now be described in conjunction with a capacitor-over-bitline type DRAM cell having bitlines running parallel to moat regions. Those of ordinary skill in the art of DRAMs will recognize that other types of DRAM cells, such as those having diagonal bitlines with respect to moat regions, may also utilize the benefits of the invention.

Figure 3:
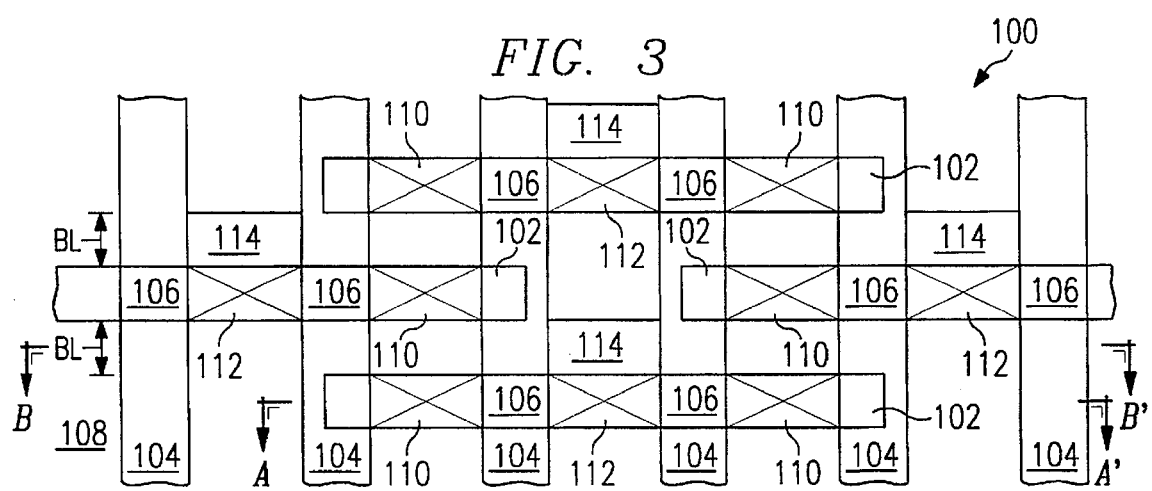
FIG. 3 is a layout view of a portion of a DRAM array according to a first embodiment of the invention.
Figure 4:
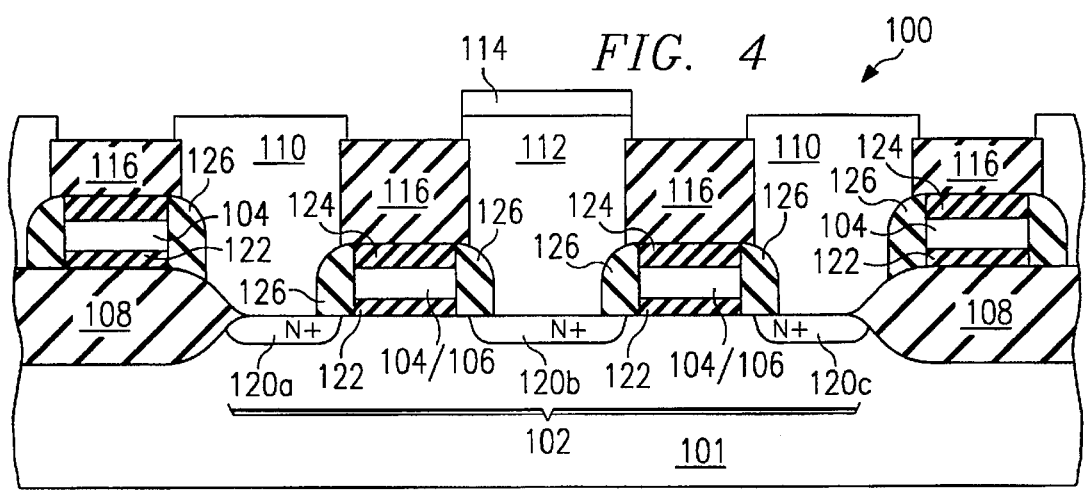
FIG. 4 is a cross-sectional view of a pair of DRAM cells along line A–A' prior to the formation of a bitline and storage capacitor according to the first embodiment of the invention.

FIGS. 3 and 4 illustrate a layout and cross-sectional view for a portion of the array of a DRAM 100 according to a first embodiment of the invention prior to the formation of the bitlines and storage capacitors. As shown, the moat regions 102 lie horizontally in a straight pattern and, depending on the maturity of the technology, may be on the order of 0.25 microns wide. An isolation structure 108 surrounds and delineates moat regions 102. Isolation structure 108 may, for example, comprise field oxide regions. However, other isolation technologies such as isolation trench may of course alternatively be used. The wordlines 104 run perpendicular to the moat regions 102 to form the pass transistor gates 106. In the preferred embodiment, wordlines 104 comprise a thin doped polysilicon layer on the order of 300–700 Å thick with an overlying layer of silicide (e.g. tungsten-silicide) on the order of 800 Å thick. Wordlines 104 may alternatively comprise other conductive materials as is known in the art. FIG. 3 illustrates the moat regions 102 extending fully under two wordlines and partially under two other wordlines. This is to account for process margins (optical proximity correction). The actual moat region of the array will conform to FIG. 4.

A doped polysilicon plug or contact (pad poly 110 and 112) is used to make contact to source/drain regions 120a–c formed in moat region 102 on opposites sides of pass transistor gates 106. Pad poly 110 and 112 extend through an interlevel dielectric layer 116 to source/drain regions 120a–c and may be on the order of 3000–4000 Å thick. In contrast to prior art structures, neither pad poly 110 and 112 extend over isolation structure 108. Pad poly 110 is used to connect a subsequently formed storage capacitor to the source/drain regions 120a&c and pad poly 112 is used in conjunction with offset connecting piece 114 to connect to a subsequently formed bitline for the case where the bitline is offset from the moat region 102. Alternatively, the storage capacitor may be offset and the bitline formed above the moat regions 102.

Figure 5:
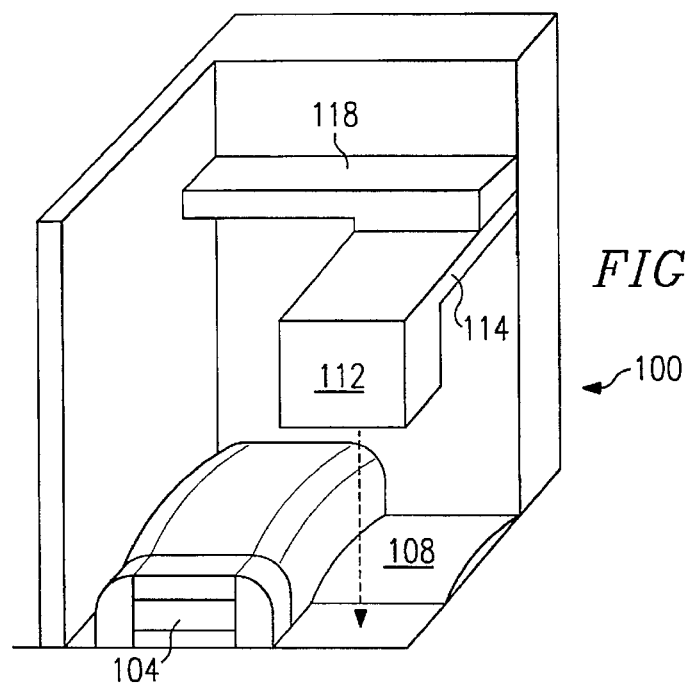
FIG. 5 is a three dimensional view of a partial DRAM cell according to the first embodiment of the invention.

As more clearly illustrated in FIG. 5, only the thin offset connecting piece 114 extends over the isolation structure 108. Pad poly 112 does not extend over the isolation structure 108. In the 3-D view of FIG. 5, the bitline 118, the offset connecting piece 114, and the pad poly 112 are shown as lifted above their position in the DRAM array 100 for ease of illustration. An advantage of the invention is that it reduces the bitline capacitance and the bitline to wordline coupling.

Figure 6:
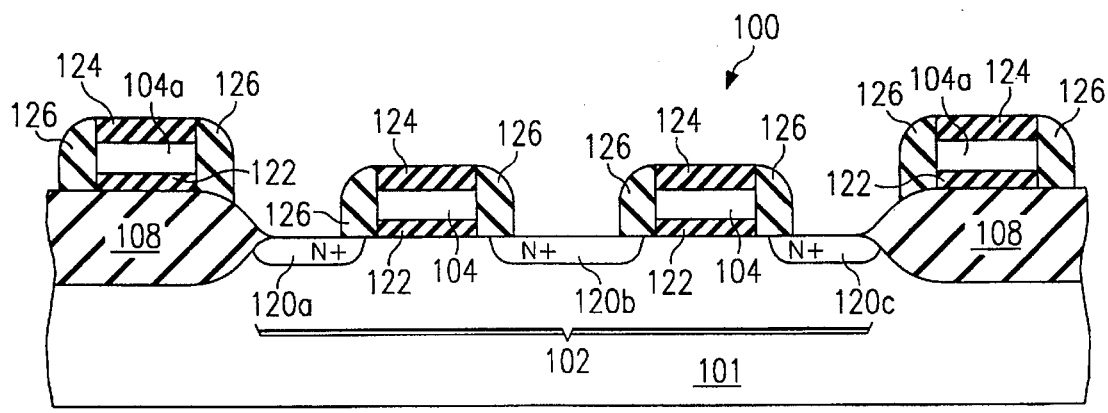
FIGS. 6–8, 9A, 9B and 10—13 are cross-sectional view of the pair of DRAM cells of FIG. 4 according to the first embodiment of the invention at various stages of fabrication.

FIG. 6 illustrates a cross-section of a partially fabricated portion of DRAM array 100. Isolation structures 108, shown here as field oxide regions, are formed in a substrate 101 and delineate moat region 102. Source/drain regions 120a-c are formed in moat region 102. Two polysilicon wordlines 104 and gate oxides 122 extend across moat region 102. Two other polysilicon wordlines 104a, over isolation structures 108, serve as pass gates for additional portions of DRAM array 108 which are not shown. A protective dielectric 124 covers wordlines 120 and a sidewall dielectric 126 is formed on the sidewalls of wordlines 104 and protective dielectric 124. Protective dielectric 124 may, for example, be on the order of 1500–2000 Å thick and sidewall dielectrics 126 may, for example, be on the order of 300–600 Å wide. For reasons that will be described later, sidewall dielectrics 126 and possibly protective dielectric 124 preferably comprise a silicon nitride. The formation of DRAM array 100 according to a first embodiment of the invention into the structure of FIG. 6 will now be described.

Figure 7:
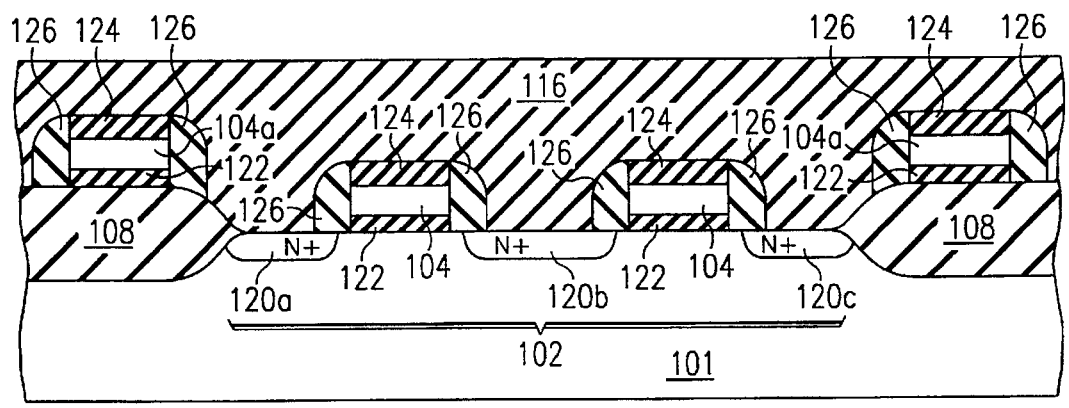

Referring to FIG. 7, an interlevel dielectric 116 is deposited over the structure to a thickness on the order of 500 Å above the highest level of the structure. Interlevel dielectric 116 may preferably be planarized at this point. Interlevel dielectric 116 comprises a material that may be etched selectively to sidewall dielectric 126. For example, if sidewall dielectric 126 comprises silicon nitride, interlevel dielectric 116 may comprise an oxide such as TEOS (tetraethoxysilane) or BPSG (boron-phosphorous silicate glass). Other examples, such as switching the composition of sidewall dielectric 126 and interlevel dielectric 116, will be apparent to those of ordinary skill in the art.

Figure 8:
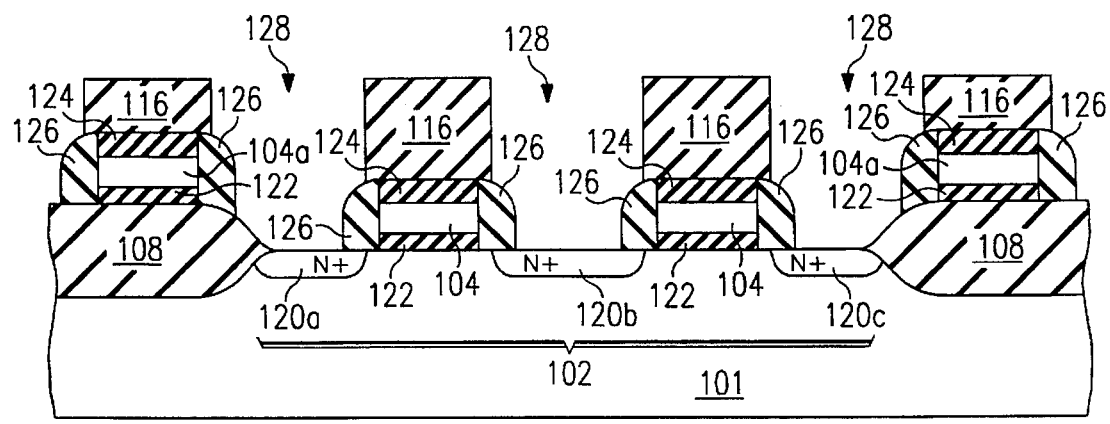

Next, a self-aligned contact process is performed. The interlevel dielectric 116 is patterned and selectively etched to create vias 128 self-aligned to the pass transistor gates (i.e. wordlines 104) as shown in FIG. 8. For example, if the sidewall dielectrics 126 comprise silicon nitride and the interlevel dielectric 116 comprises TEOS or BPSG, conventional etch chemistries may be used which will remove the interlevel dielectric 116 without damaging sidewall dielectrics 126. It will be apparent to those of ordinary skill in the art that other combination of dielectrics may be used as long as the interlevel dielectric 116 may be etched selectively to sidewall dielectrics 126. As discussed above, protective dielectric 124 is preferably of the same material as sidewall dielectrics 126 to allow for pattern misalignment.

Figure 9A:
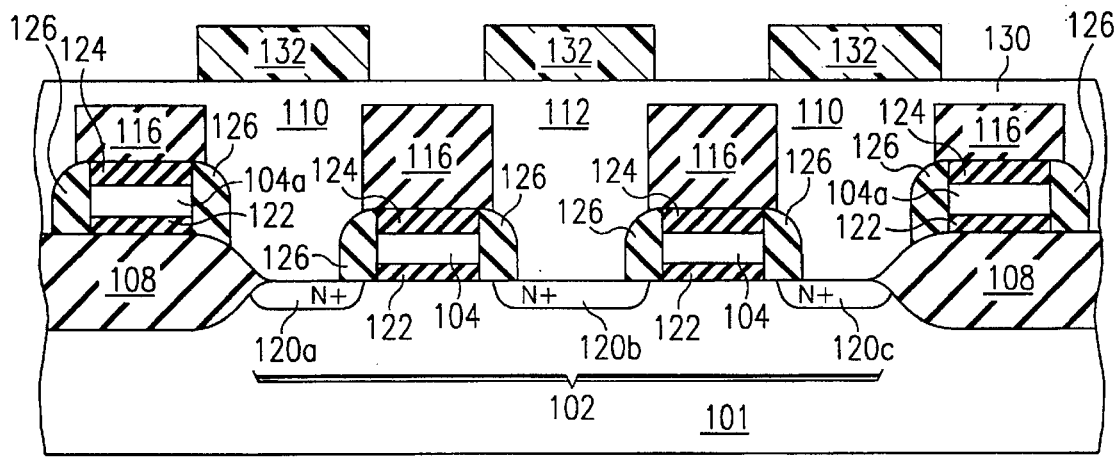
Figure 9B:
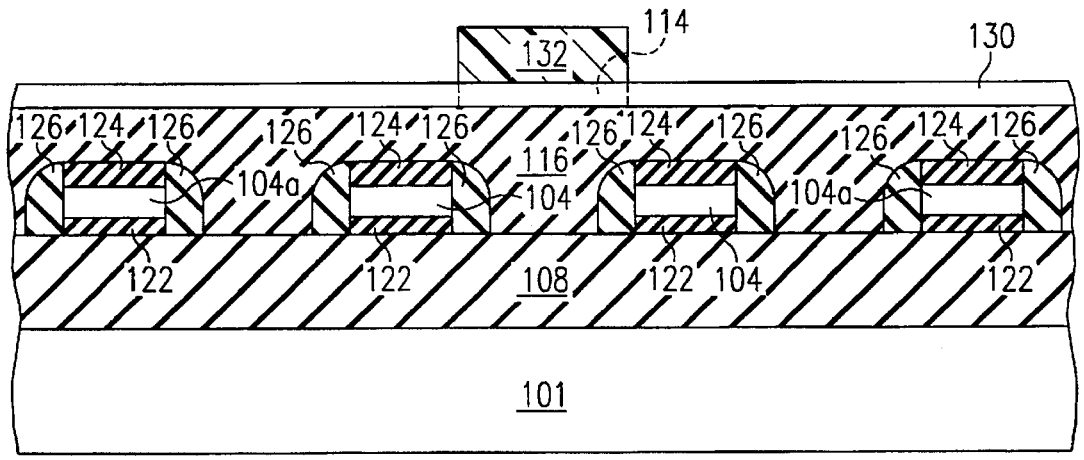
Figure 10:
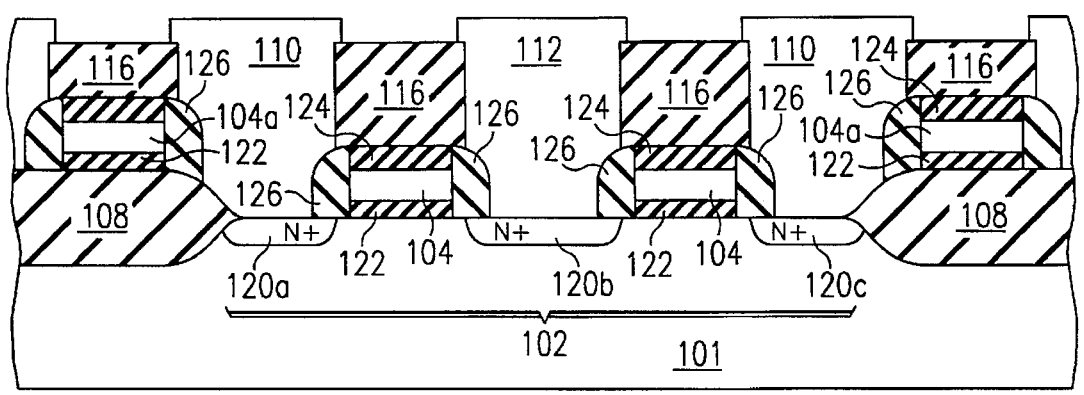

Next, a layer of polysilicon 130 is deposited. The polysilicon layer 130 is preferably in-situ doped and etched beck to roughly 500–1000 Å above the level of interlevel dielectric 116. The polysilicon layer is then patterned as shown in FIG. 9a and etched to form pad poly 110 and 112, as shown in FIG. 10. In addition to covering the area where pad poly 110 and 112 are formed, pattern 132 also includes a portion for covering the area where offset connecting piece 114 is to be formed as shown in FIG. 9b. FIG. 9b illustrates a cross-section of DRAM array 100 offset from the cross-section of FIG. 9a where the bitline is to be formed (line B–B' of FIG. 3). The pattern 132 is then removed.

Figure 11:
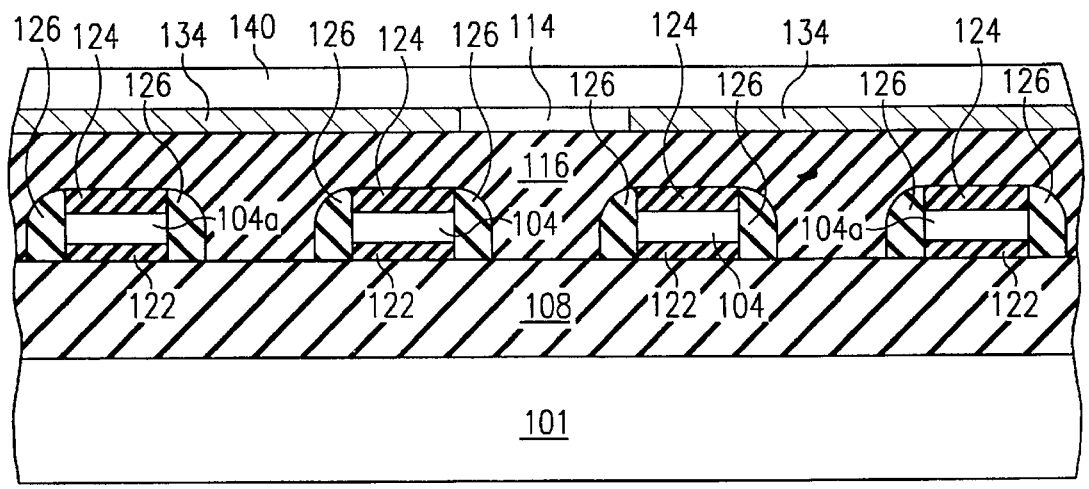
Figure 12:
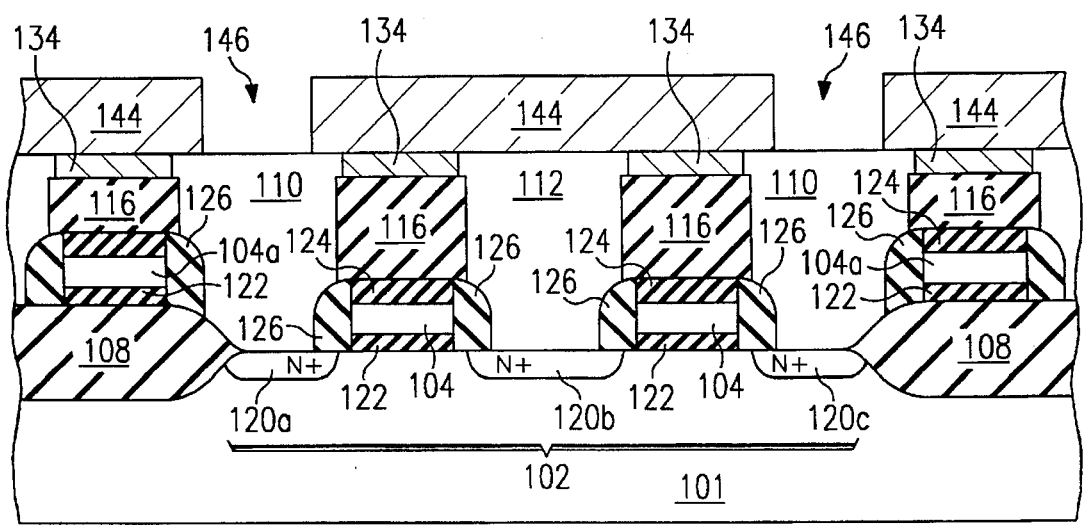

Processing then continues to form bitline 140 and storage capacitor 142. A dielectric layer 134 is deposited over the surface of the structure to a thickness on the order of 4000 Å. Dielectric layer 134 is then preferably planarized and etched back to a thickness on the order of 500 Å above the top surface of the pad poly 110 and 112. Dielectric layer 134 is then patterned and etched to expose offset connecting piece 114. A second layer of polysilicon or silicide or combined polysilicon/silicide is then deposited/formed to a thickness of the order of 1000 Å protective dielectric layer is then deposited to a thickness on the order of 2000 Å. The second layer of polysilicon/silicide and the protective dielectric layer are then patterned and etched to form bitline 140 as shown in FIG. 11 which corresponds to a cross-section through line B–B' of FIG. 3. Next, a second interlevel dielectric 144 is deposited over the structure and preferably planarized as shown in FIG. 12 which corresponds to the cross-section of line A–A' of FIG. 3. Interlevel dielectric layer 144 may have a thickness on the order of 2500 Å. Contact holes 146 are then etched through the second interlevel dielectric 144 to pad poly 110.

Figure 13:
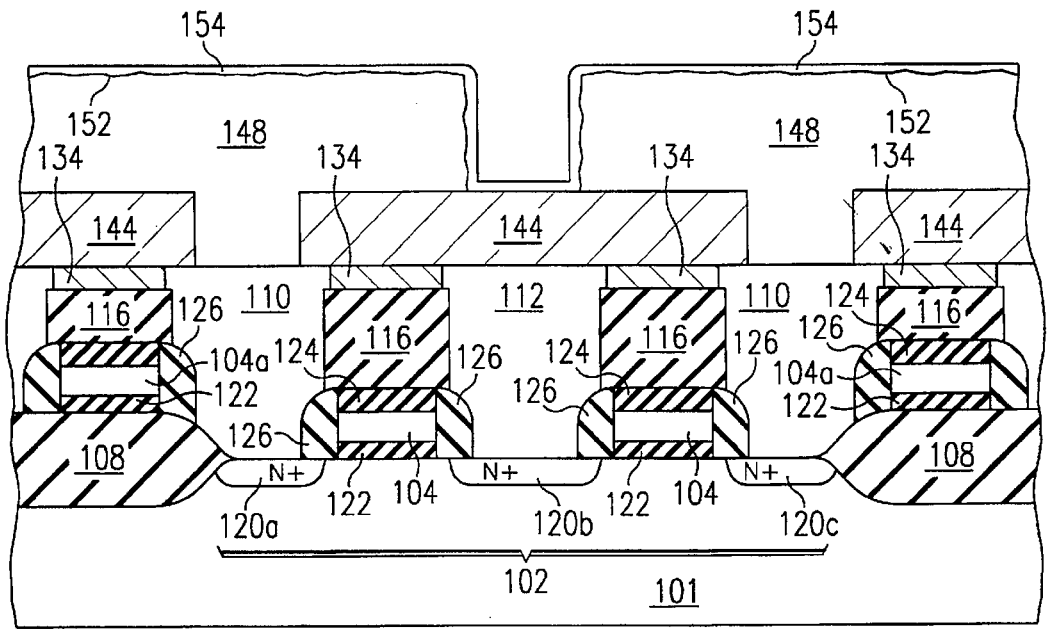

Referring to FIG. 13, a third layer of polysilicon is deposited, patterned and etched to form the bottom node 148 of storage capacitor 150. The thickness of bottom node 148 may vary be design, but may, for example, be on the order of 7000 Å. The formation of storage capacitor 150 is completed by forming a capacitor dielectric 152, for example a oxide/nitride bilayer or tantalum-oxide or a high K dielectric constant material, and then top node 154. Top node 154 may comprise, for example, polysilicon, titanium-nitride, or a metal such as tungsten. DRAM array 100 has reduced bitline capacitance and reduced bitline to wordline capacitance due to pad poly 110 and 112 extending only over moat region 102 and not over isolating structure 108. DRAM array 100 has reduced bitline capacitance with the feature of top node 154 extending only over the bitline 140 also. The first embodiment of the invention also has the advantage of reduced soft error rate compared to the prior art DASH array because the invention has a shorter transistor junction than the DASH's diagonal moat.

Figure 14:
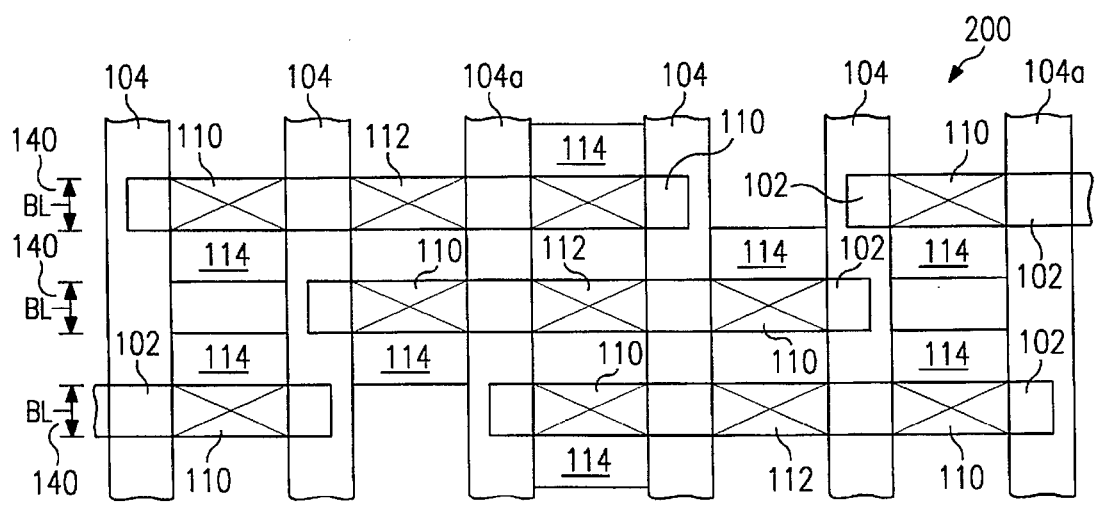
FIG. 14 is a layout view of a portion of a DRAM array according to a second embodiment of the invention.
Figure 15:
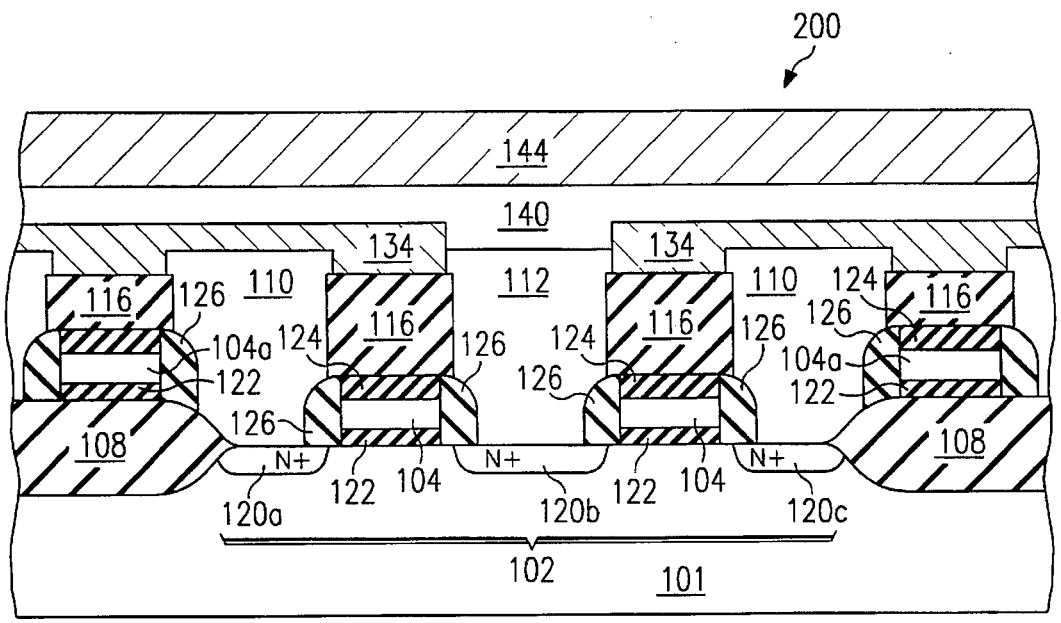
FIG. 15 is a cross-sectional view of a portion of the DRAM array of FIG. 4 along line A–A'.
Figure 16:
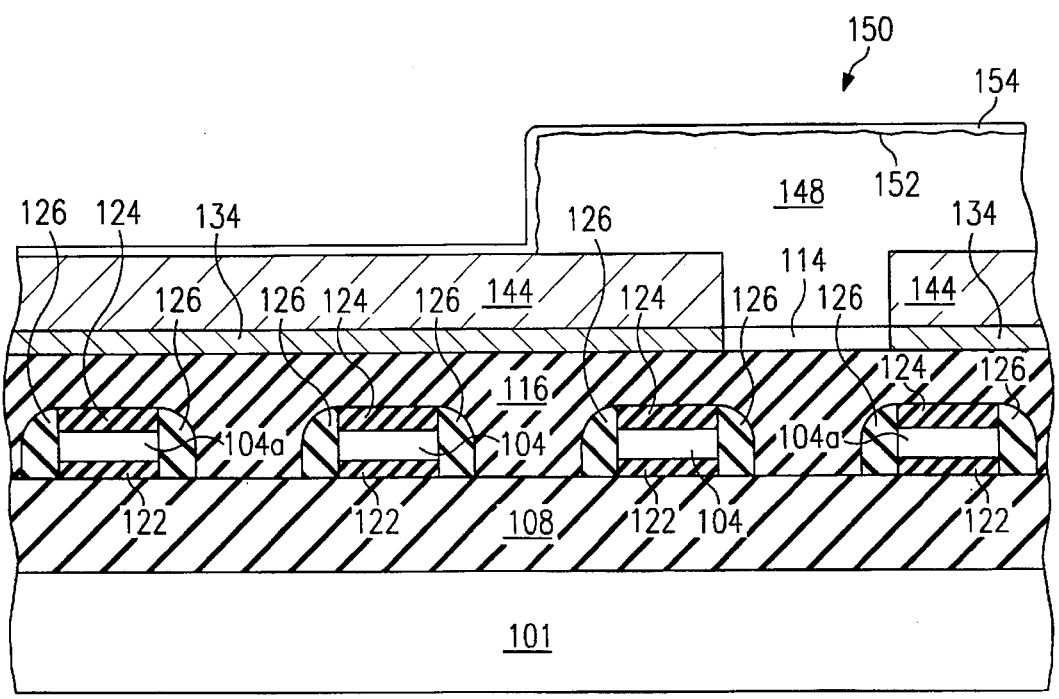
FIG. 16 is a cross-sectional view of the portion of the DRAM array of FIG. 4 along line B–B'.

A second embodiment of the invention is shown in FIGS. 14–16. FIG. 14 illustrates a layout of a portion of a DRAM array 200 according to the invention. FIGS. 15 and 16 illustrate cross-sectional view of DRAM array 200 through lines A–A' and B–B' respectively. The second embodiment of the invention has the storage capacitor 150 offset from the moat region 102 and the bitline 140 running over moat region 102. In this embodiment, offset connecting piece 114 is used to connect pad poly 110 to the storage capacitors 150 instead of connecting pad poly 112 to the bitline 140. Similar to the first embodiment and in contrast to prior art designs, the pad poly 110 and 112 do not extend over isolating structure 108. The method of forming DRAM array 200 is similar to that described above for the first embodiment.

Figure 1:
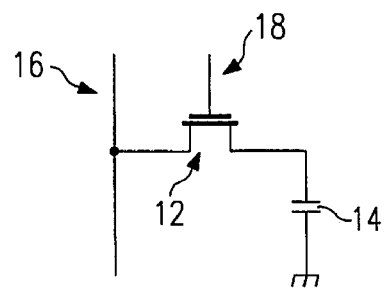
FIG. 1 is a schematic diagram of a prior art DRAM cell.
Figure 17:
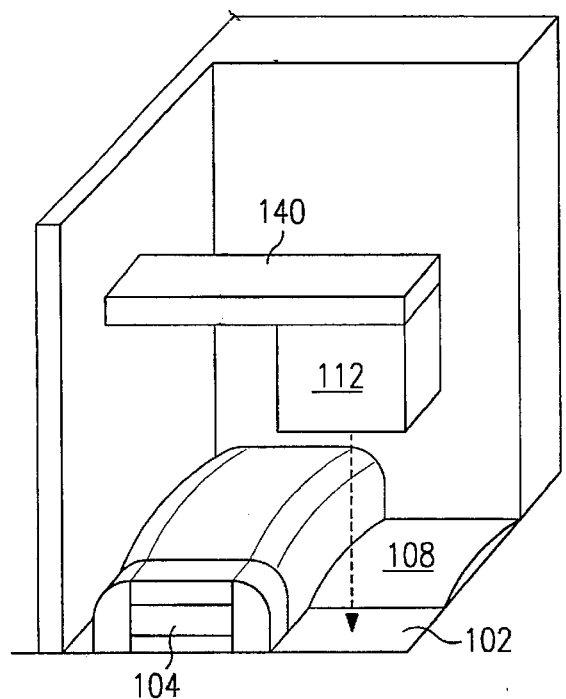
FIG. 17 is a three dimensional view of a partial DRAM cell according to the second embodiment of the invention.
Figure 2:
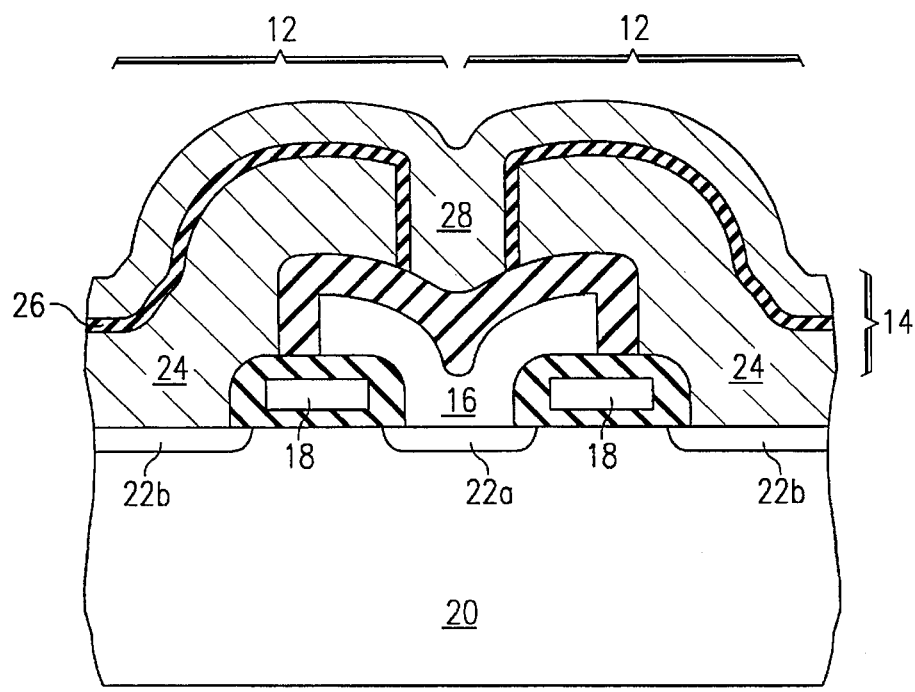
FIG. 2 is a cross-sectional view of a prior art DRAM cell.

FIG. 17 is a three dimensional view of a partial DRAM cell of DRAM array 200. Bitline 140 and pad poly 112 are shown lifted above their actual position. Bitline 140 is connected directly to pad poly 112 and runs above and parallel to moat region 102. Because bitline 140 is not offset from moat region 102, the offset connecting piece 114 is not needed to connect the bitline 140 to pad poly 112. Offset connecting piece 114 is instead used to connect the storage capacitor 150 to pad poly 112 as shown in FIGS. 14–16. The second embodiment has the advantage of even further reducing the bitline capacitance and a quarter pitch layout may be used whereas the first embodiment is preferably a half pitch layout.

While this invention has been described with reference to illustrative embodiments, this description is not intended to be construed in a limiting sense. Various modifications and combinations of the illustrative embodiments, as well as other embodiments of the invention such as using bitlines the run diagonally with respect to moat regions and/or wordlines, will be apparent to persons skilled in the art upon reference to the description. It is therefore intended that the appended claims encompass any such modifications or embodiments.

What is claimed is:

1. A DRAM cell comprising:

a moat region;

an isolating structure surrounding and defining said moat region;

a pass transistor located in said moat region;

an interlevel dielectric layer located above said pass transistor and said isolating structure;

a first and a second doped polysilicon plug each extending through said interlevel dielectric layer to said moat region; and an offset connecting piece extending from said first doped polysilicon plug to over a portion of said isolating structure, wherein said offset connecting piece is separated from said isolating structure by said interlevel dielectric layer.

2. The DRAM cell of claim 1 further comprising a bitline offset from said moat region, said bitline connected to said first doped polysilicon plug by said offset connecting piece.

3. The DRAM cell of claim 2 further comprising a storage capacitor located above said moat region, wherein said storage capacitor is connected to said second doped polysilicon plug.

4. The DRAM cell of claim 2 wherein said bitline runs parallel to said moat region.

5. The DRAM cell of claim 1 further comprising a storage capacitor offset from said moat region and connected to said first doped polysilicon plug through said offset connecting piece.

6. The DRAM cell of claim 5, further comprising a bitline located above said moat region and connected to said second doped polysilicon plug.

7. The DRAM cell of claim 5 wherein said bitline runs parallel with said moat region.

8. A DRAM comprising an array of DRAM cell pairs, each DRAM cell pair comprising:

a moat region;

an isolating structure surrounding and defining said moat region;

a first and a second pass transistor located in said moat region each having a wordline gate and a first source/drain region, wherein said first and second pass transistors share a common second source/drain region;

an interlevel dielectric layer located above said first and second pass transistors and said isolating structure;

three polysilicon plugs each extending through said interlevel dielectric layer to one of said first and second source/drain regions; and a first offset connecting piece extending from one of said three polysilicon plugs to over a portion of said isolating structure, wherein said offset connecting piece extends over said isolating structure and is separated from said isolating structure by said interlevel dielectric layer.

9. The DRAM array of claim 8, further comprising a bitline, wherein said first offset connecting piece extends from a first of said three polysilicon plugs to said bitline.

10. The DRAM array of claim 9, further comprising two storage capacitors directly connected to a second and a third of said three polysilicon plugs, respectively.

11. The DRAM array of claim 9, wherein said bitline is offset from and parallel to said moat region.

12. The DRAM array of claim 8, further comprising:

a first storage capacitor connected to said first offset connecting piece;

a second offset connecting piece connected to a second of said three polysilicon plugs; and a second storage capacitor connected to said second of said three polysilicon plugs through said second offset connecting piece.

13. The DRAM array of claim 12, further comprising a bitline connected directly to a third of said three polysilicon plugs.

14. The DRAM array of claim 13 wherein said bitline is located above and parallel to said moat region.

15. The DRAM array of claim 8 wherein said plurality of DRAM cell pairs are arranged using a quarter pitch layout.

16. The DRAM array of claim 8 wherein said plurality of DRAM cell pairs are arranged using a half pitch layout.

* * * * *